United States Patent
So et al.

(10) Patent No.: US 11,839,100 B2
(45) Date of Patent: Dec. 5, 2023

(54) DISPLAY DEVICE

(71) Applicant: Samsung Display Co., Ltd., Yongin-si (KR)

(72) Inventors: Dongyoon So, Yongin-si (KR); Dongmin Kim, Yongin-si (KR); Jungtae Kim, Yongin-si (KR); Kyungmin Park, Yongin-si (KR); Hyungjun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/937,641

(22) Filed: Oct. 3, 2022

(65) Prior Publication Data
US 2023/0024691 A1   Jan. 26, 2023

Related U.S. Application Data (63) Continuation of application No. 16/879,621, filed on May 20, 2020, now Pat. No. 11,462,712.

(30) Foreign Application Priority Data

May 28, 2019   (KR) ........................ 10-2019-0062585

(51) Int. Cl.
| | |
|---|---|
| *H10K 50/842* | (2023.01) |
| *H10K 59/40* | (2023.01) |
| *H10K 59/131* | (2023.01) |
| *H10K 59/121* | (2023.01) |

(52) U.S. Cl.
CPC ..... *H10K 50/8426* (2023.02); *H10K 59/1213* (2023.02); *H10K 59/131* (2023.02); *H10K 59/40* (2023.02)

(58) Field of Classification Search
CPC ............... H01L 51/5246; H01L 27/323; H01L 27/3262; H01L 27/3276; H01L 23/60; H01L 51/5262
See application file for complete search history.

(56) References Cited

U.S. PATENT DOCUMENTS

| | | |
|---|---|---|
| 5,691,782 A | 11/1997 | Nishikawa et al. |
| 8,766,323 B2 | 7/2014 | Kim et al. |
| 9,818,975 B2 | 11/2017 | Hong et al. |

(Continued)

FOREIGN PATENT DOCUMENTS

| | | |
|---|---|---|
| KR | 10-0343077 B1 | 12/2002 |
| KR | 10-2015-0114010 A | 10/2015 |

(Continued)

*Primary Examiner* — Kyoung Lee
(74) *Attorney, Agent, or Firm* — Lewis Roca Rothgerber Christie LLP (57) ABSTRACT

A display device includes a first substrate, a plurality of pixels on the first substrate, a second substrate on the plurality of pixels, a sealing portion surrounding the plurality of pixels and located between the first substrate and the second substrate, a first wiring extending in a first direction outside the plurality of pixels, and a second wiring partially surrounding the plurality of pixels, in a plane view, in which the second wiring comprises an extension portion arranged in parallel to the first direction between the first wiring and an edge of the first substrate, and the sealing portion fills an area between the extension portion and the first wiring.

20 Claims, 10 Drawing Sheets

(56) References Cited

U.S. PATENT DOCUMENTS

| | | |
|---|---|---|
| 9,989,811 B2 | 6/2018 | Go et al. |
| 10,109,649 B2 | 10/2018 | Jang |
| 11,462,712 B2 * | 10/2022 | So .................. H01L 27/3276 |
| 2016/0218165 A1 | 7/2016 | Park et al. |
| 2019/0165079 A1 | 5/2019 | Cho et al. |

FOREIGN PATENT DOCUMENTS

| | | |
|---|---|---|
| KR | 10-2016-0091529 A | 8/2016 |
| KR | 10-1641363 B1 | 8/2016 |
| KR | 10-2016-0119376 A | 10/2016 |
| KR | 10-2017-0031850 A | 3/2017 |
| KR | 10-1800285 B1 | 12/2017 |

\* cited by examiner

DISPLAY DEVICE

CROSS-REFERENCE TO RELATED APPLICATION

This application is a continuation of U.S. application Ser. No. 16/879,621, filed May 20, 2020, which claims priority to and the benefit of Korean Patent Application No. 10-2019-0062585, filed on May 28, 2019, in the Korean Intellectual Property Office, the entire content of which is incorporated herein by reference.

BACKGROUND

1. Field

One or more embodiments of the present disclosure relate to display devices.

2. Description of the Related Art

It is a current trend to remove physical buttons from the front surface of a display device and increase a display area for displaying an image, and research on decreasing a non-display area that does not display an image has been conducted. When the non-display area of a display device decreases, an interval between wirings arranged in the non-display area decreases as well, and thus, a risk of a short-circuit between the wirings may be increased.

SUMMARY

One or more embodiments of the present disclosure include a display device which may prevent a short-circuit from occurring between wirings while a non-display area is reduced (or may reduce a likelihood or degree of such a short-circuit).

Additional aspects of embodiments will be set forth in part in the description which follows and, in part, will be apparent from the description, or may be learned by practice of the presented embodiments.

According to one or more embodiments, a display device includes a first substrate, a plurality of pixels on the first substrate, a second substrate on the plurality of pixels, a sealing portion surrounding the plurality of pixels and located between the first substrate and the second substrate, a first wiring extending in a first direction outside the plurality of pixels, and a second wiring partially surrounding the plurality of pixels, in a plane view, in which the second wiring comprises an extension portion arranged in parallel to the first direction between the first wiring and an edge of the first substrate, and the sealing portion fills an area between the extension portion and the first wiring.

The sealing portion may overlap a part of the extension portion and a part of the first wiring and come in contact with a side surface of the extension portion and a side surface of the first wiring, which are arranged to face each other, in an area between the extension portion and the first wiring.

An outer edge of the extension portion may be located outside the sealing portion.

An outer edge of the extension portion may be located between the sealing portion and a side of the second substrate, in a plane view.

A side surface of the extension portion and a side surface of the first wiring facing each other may be located at different heights.

A trap having a concave shape may be located between the extension portion and the first wiring, and the side surface of the extension portion may be located in the trap.

The display device may further include a blocking pattern on the second substrate, in which the blocking pattern covers a side surface of the extension portion facing the first wiring, in a plane view.

The blocking pattern may include a first region having transmissivity and a second region that is opaque and located at at least one side of the first region, and the second region may cover the side surface of the extension portion.

Each of the plurality of pixels may include a thin film transistor and an organic light-emitting device electrically coupled to the thin film transistor.

The second wiring may have a structure in which a first layer, a second layer, and a third layer are sequentially stacked, the first layer and the third layer including Ti and the second layer including Al.

According to one or more embodiments, a display device includes a first substrate including a display area, a peripheral area around the display area, and a pad area in the peripheral area, a second substrate above the first substrate and having an area less than the first substrate, a sealing portion surrounding the display area and between the first substrate and the second substrate, a first wiring in the peripheral area and extending in a first direction between the pad area and one side of the display area adjacent to the pad area, a second wiring partially surrounding the display area, and a blocking pattern on the second substrate, in which the second wiring may include an extension portion extending in the first direction between the first wiring and the pad area, and in a plane view, the blocking pattern is located to cover a side surface of the extension portion facing the first wiring, and an outer edge of the extension portion is located between the sealing portion and a side of the second substrate.

The sealing portion may be located on the extension portion.

The display device may further include a pressure sensing unit on the second substrate, in which the blocking pattern includes a same material as a wiring of the pressure sensing unit.

The extension portion may be located further outside the blocking pattern, in a plane view.

The blocking pattern may include a first region having transmissivity and a second region that is opaque and is located at at least one side of the first region, and the second region may cover the side surface of the extension portion.

The sealing portion may fill an area between the extension portion and the first wiring.

The sealing portion may overlap a part of the extension portion and a part of the first wiring and come in contact with a side surface of the extension portion and a side surface of the first wiring, which are arranged to face each other, in an area between the extension portion and the first wiring.

A trap having a concave shape may be located between the extension portion and the first wiring, and the side surface of the extension portion facing the first wiring may be located in the trap so as to be located at a height lower than a side surface of the first wiring facing the extension portion.

The sealing portion may extend along the second wiring covering an outer end portion of the second wiring and comes in direct contact with the second wiring.

A plurality of pixels may be located in the display area, each of the plurality of pixels including a thin film transistor and an organic light-emitting device electrically coupled to the thin film transistor.

Aspects and features of embodiments of the present disclosure, other than those mentioned herein above may be clarified from the following drawings, claims, and the detailed description of the present disclosure.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Various modifications may be applied to the present embodiments, and particular embodiments will be illustrated in the drawings and described in the detailed description section. The effect and features of the present embodiments, and a method to achieve the same, will be clearer by referring to the detailed descriptions herein below together with the drawings. However, the present embodiments may be implemented in various forms, not by being limited to the embodiments presented herein below.

It will be understood that although the terms "first," "second," etc. may be used herein to describe various components, these components should not be limited by these terms. These terms are only used to distinguish one component from another.

As used herein, the singular forms "a," "an" and "the" are intended to include the plural forms as well, unless the context clearly indicates otherwise.

It will be further understood that the terms "comprises" and/or "comprising," as used herein, specify the presence of stated features or components, but do not preclude the presence or addition of one or more other features or components.

It will be understood that when a layer, region, or component is referred to as being "on" or "formed on" another layer, region, or component, it can be directly or indirectly on or formed on the other layer, region, or component. For example, intervening layers, regions, or components may be present.

Sizes of components in the drawings may be exaggerated for convenience of explanation. In other words, because sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. For the purposes of this disclosure, "at least one of X, Y, and Z" and "at least one selected from the group consisting of X, Y, and Z" may be construed as X only, Y only, Z only, or any combination of two or more of X, Y, and Z, such as XYZ, XYY, YZ, and ZZ. Hereinafter, the subject matter of the present disclosure will be described in more detail by explaining example embodiments of the disclosure with reference to the attached drawings. Like reference numerals in the drawings denote like elements.

Figure 1:
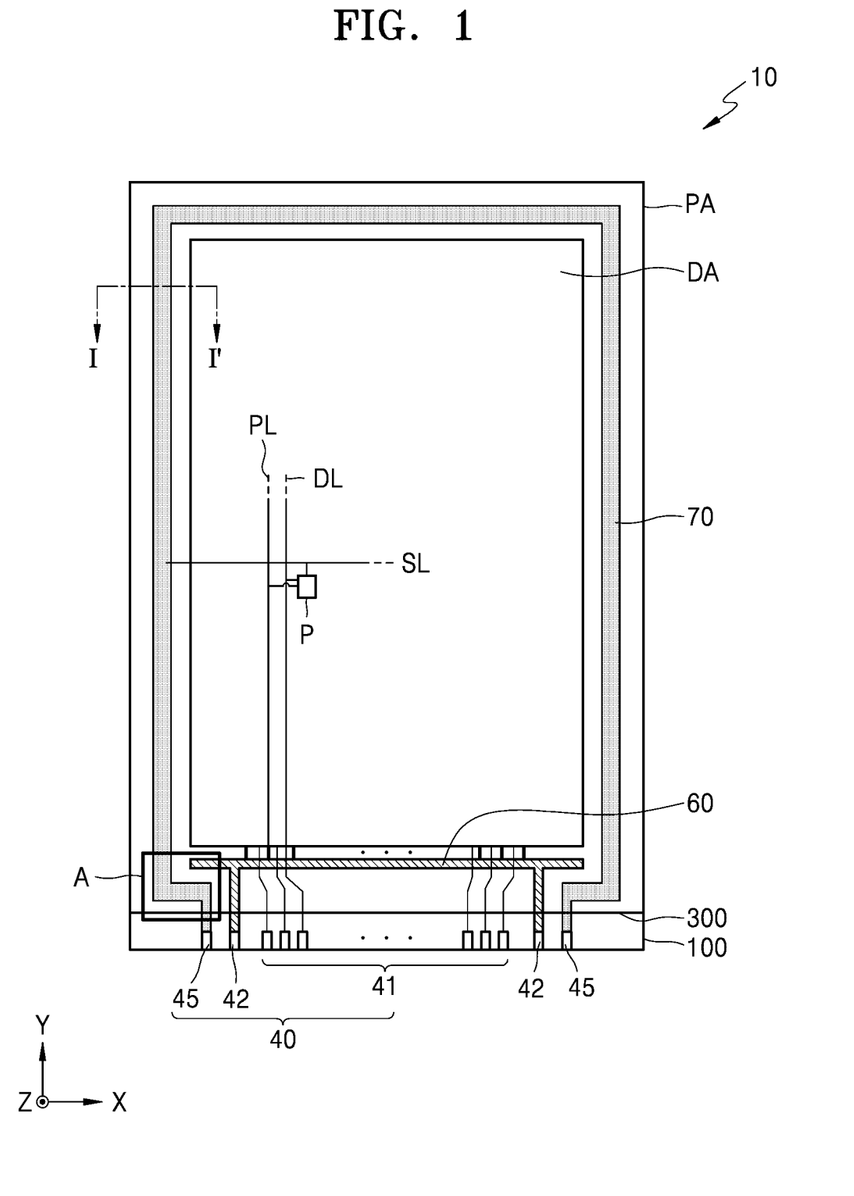
FIG. 1 is a plan view schematically illustrating an example of a display device according to an embodiment of the present disclosure.
Figure 2:
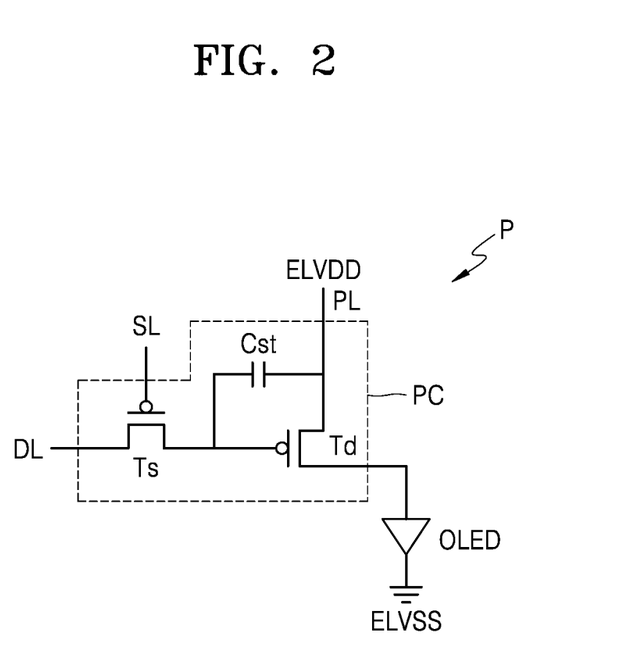
FIG. 2 is an equivalent circuit diagram of any one (sub-)pixel of a display device according to an embodiment of the present disclosure.

FIG. 1 is a plan view schematically illustrating an example of a display device 10 according to an embodiment of the present disclosure. FIG. 2 is an equivalent circuit diagram of any one (sub-)pixel of the display device 10 of FIG. 1.

Referring to FIG. 1, the display device 10 according to the present embodiment may include a display area DA where an image is displayed and a peripheral area PA around the display area DA. In other words, a first substrate 100 may be understood to include the display area DA and the peripheral area PA.

In the display area DA, (sub-)pixels P are coupled to a scan line SL extending in an X-direction and a data line DL extending in a Y-direction crossing the X-direction. Each of the (sub-)pixels P may include a light-emitting device configured to emit red, green, blue, or white light. Each of the (sub-)pixels P may include an organic light emitting diode (OLED) as the light-emitting device.

Referring to FIG. 2, one (sub-)pixel P may include a pixel circuit PC coupled to the scan line SL and the data line DL and the OLED coupled to the pixel circuit PC.

The pixel circuit PC may include a driving thin film transistor Td, a switching thin film transistor Ts, and a storage capacitor Cst. The switching thin film transistor Ts is coupled to the scan line SL and the data line DL, and may transmit, to the driving thin film transistor Td, a data signal input via the data line DL in response to a scan signal input via the scan line SL.

The storage capacitor Cst is coupled to the switching thin film transistor Ts and a driving voltage supply line PL, and may store a voltage equivalent to a difference between a voltage received from the switching thin film transistor Ts and a driving voltage ELVDD supplied to the driving voltage supply line PL.

The driving thin film transistor Td is coupled to the driving voltage supply line PL and the storage capacitor Cst, and may control a driving current flowing in the OLED from the driving voltage supply line PL in response to a value of the voltage stored in the storage capacitor Cst. The OLED may be configured to emit light having a set or certain brightness according to the driving current. The OLED may be configured to emit, for example, red, green, blue, or white light.

Although FIG. 2 illustrates a case in which one the (sub-)pixel P includes two thin film transistors Ts and Td and one storage capacitor Cst, the present disclosure is not limited thereto. In another embodiment, the pixel circuit PC of the (sub-)pixel P may be variously changed so as to include three or more thin film transistors and/or two or more storage capacitors.

Referring back to FIG. 1, the peripheral area PA may surround the display area DA. In other words, the peripheral area PA may be an area that surrounds the (sub-)pixels P. A pad area 40, a first wiring 60, a second wiring 70, and a driving unit may be in the peripheral area PA. The driving unit may include a light-emitting driving circuit or a scan driving circuit.

The pad area 40, where various suitable electronic elements or printed circuit substrates are electrically attached, is at one side of the first substrate 100 and may include a plurality of terminals 41, 42, and 45. The pad area 40 is at one outer side of the display area DA in the peripheral area PA, exposed by not being covered by an insulating layer, and electrically coupled to a flexible printed circuit substrate, where a data driving circuit or the like is mounted.

The first wiring 60 may be in the peripheral area PA. The first wiring 60 may extend in a first direction X outside the (sub-)pixels P. For example, the first wiring 60 may be between one side of the display area DA adjacent to the pad area 40 and the pad area 40 and may be longer than the one side of the display area DA. The first wiring 60 may be a driving power supply wiring. Accordingly, the driving voltage ELVDD supplied through the terminal 42 may be provided to each of the (sub-)pixels P via a driving voltage supply line PL coupled to the first wiring 60.

The second wiring 70 may be in the peripheral area PA and may at least partially surround the display area DA. This may be interpreted such that the second wiring 70 partially surrounds the (sub-)pixels P, in a plane view (e.g., a plan view). For example, the second wiring 70 having a loop shape with one open side facing one side of the display area DA adjacent to the pad area 40 may extend along an edge of the first substrate 100, except an edge where the pad area 40 is located. The second wiring 70 may be a common power supply wiring. Accordingly, the second wiring 70 may be coupled to the terminal 45 and provide common power ELVSS to a common electrode of the OLED of the (sub-)pixel P.

A second substrate 300 may be located above the (sub-)pixels P to overlap with the first substrate 100, and a sealing portion may be provided between the first substrate 100 and the second substrate 300, surrounding the (sub-)pixels P, to bond the first substrate 100 to the second substrate 300. The second substrate 300 may have an area less than the first substrate 100, and the pad area 40 arranged at one edge of the first substrate 100 may not be covered by the second substrate 300. For example, in some embodiments the second substrate 300 does not extend over the pad area 40.

A pressure sensing unit for generating an input signal due to contact by an external touch input device such as a user's finger or a pen may be located on the second substrate 300. The pressure sensing unit may be formed directly on an upper surface of the second substrate 300. In an example, the pressure sensing unit may be a capacitive type (e.g., a capacitive kind) in which a change in capacitance is generated by a touch.

Figure 3:
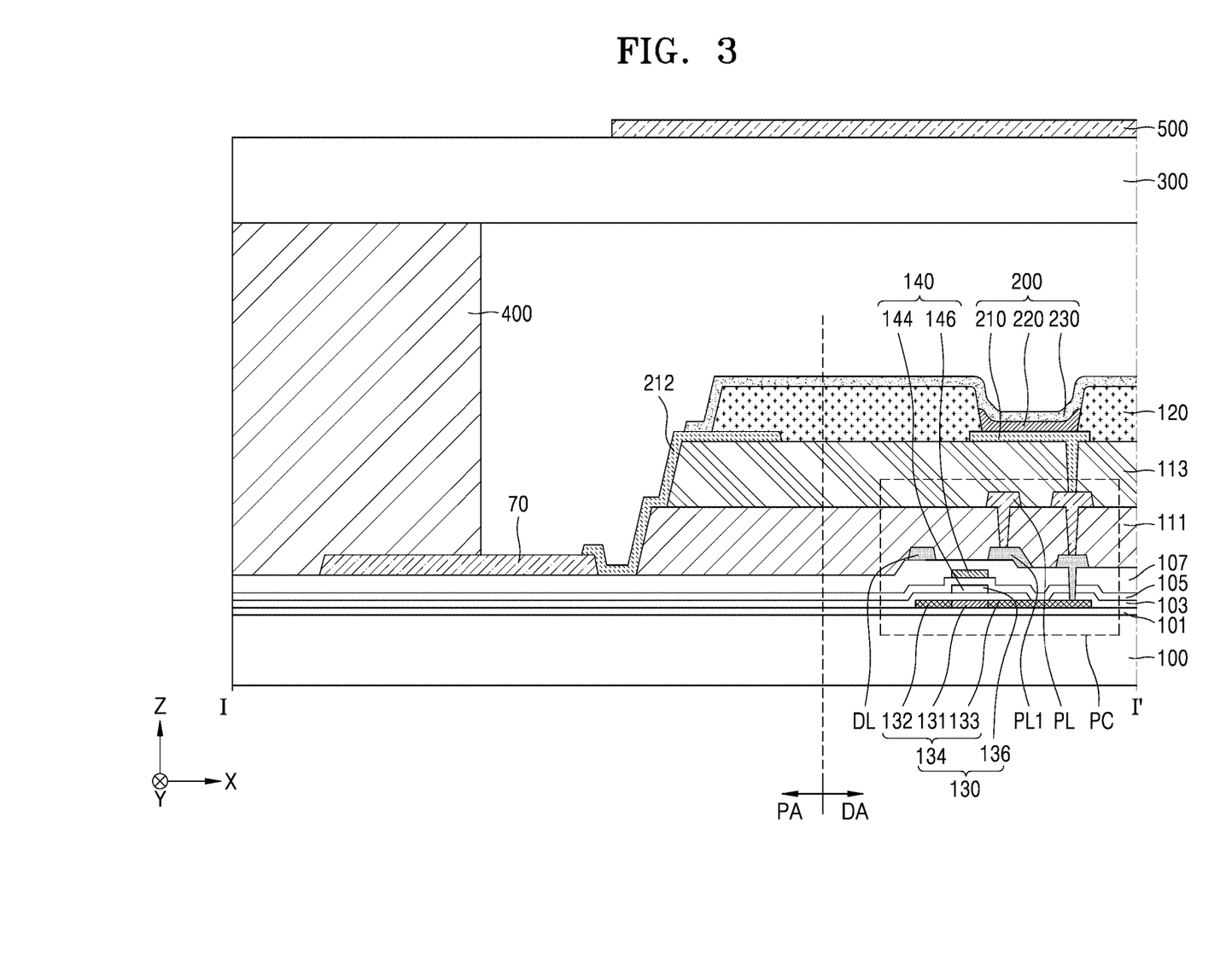
FIG. 3 is a schematic cross-sectional view taken along line I-I' of FIG. 1, according to an embodiment.

FIG. 3 is a schematic cross-sectional view taken along line I-I' of FIG. 1, according to an embodiment.

Referring to FIG. 3, the pixel circuit PC and a light-emitting device 200 may be located in the display area DA on the first substrate 100, and the second wiring 70 and so forth may be in the peripheral area PA on the first substrate 100.

The first substrate 100 may include various suitable materials such as, for example, a glass material, a metal material, and/or a plastic material such as polyethylene terephthalate (PET), polyethylene naphthalate (PEN), and/or polyimide. The second substrate 300 may include a transparent material. For example, the second substrate 300 may include various suitable materials such as, for example, a glass material, and/or a plastic material such as polyethylene terephthalate (PET), polyethylene naphthalate (PEN), and/or polyimide. The first substrate 100 and the second substrate 300 may include the same material or different materials.

A buffer layer 101 may be formed on the first substrate 100. The buffer layer 101 may block foreign materials or moisture from intruding through the first substrate 100 (or reduce an amount or likelihood of foreign materials or moisture penetrating through the first substrate 100). For example, the buffer layer 101 may include an inorganic material such as silicon oxide (SiOx), silicon nitride (SiNx), and/or silicon oxynitride (SiON), and may include a single layer or a multilayer. The buffer layer 101 may be formed in the display area DA and the peripheral area PA.

A thin film transistor 130, a storage capacitor 140, and the light-emitting device 200 electrically coupled to the thin film transistor 130 and the storage capacitor 140 may be located in the display area DA on the first substrate 100. The light-emitting device 200 may include, for example, an organic light-emitting device. The thin film transistor 130 of FIG. 3 may correspond to the driving thin film transistor Td of FIG. 2 provided in the pixel circuit PC, and the storage capacitor 140 may correspond to the storage capacitor Cst of FIG. 2, which is described with reference to FIG. 2.

The thin film transistor 130 may include a semiconductor layer 134 and a gate electrode 136. The semiconductor layer 134 may include, for example, polysilicon. The semiconductor layer 134 may include a channel region 131 that overlaps with the gate electrode 136, and a source region 132 and a drain region 133 that are at both sides of the channel region 131 and doped with impurities having a concentration higher than that of the channel region 131. The impurities may include N-type impurities or P-type impurities. The source region 132 and the drain region 133 may be understood respectively to be a source electrode and a drain electrode of the thin film transistor 130. In another embodiment, the semiconductor layer 134 may include amorphous silicon or an organic semiconductor material. In another embodiment, the semiconductor layer 134 may include an oxide semiconductor.

The pixel circuit PC, as described herein above with reference to FIG. 2, may further include the switching thin film transistor Ts of FIG. 2. Furthermore, the semiconductor layer 134 of the thin film transistor 130 and the semiconductor layer of the switching thin film transistor Ts of FIG. 2 may include materials that are different from each other. For example, any one of the semiconductor layer 134 of the thin film transistor 130 and the semiconductor layer of the switching thin film transistor Ts of FIG. 2 may include an oxide semiconductor, and the other may include polysilicon.

A gate insulating layer 103 may be between the semiconductor layer 134 and the gate electrode 136. The gate insulating layer 103 may include an inorganic insulating layer including a material such as SiON, SiOx, and/or SiNx and the gate insulating layer 103 may include a single layer or a multilayer.

The storage capacitor 140 may include a lower electrode 144 and an upper electrode 146 that overlap with each other. A first interlayer insulating layer 105 may be between the lower electrode 144 and the upper electrode 146.

The first interlayer insulating layer 105, which is a layer having a set or certain dielectric constant, may include an inorganic insulating layer including a material such as SiON, SiOx, and/or SiNx and may include a single layer or a multilayer. Although FIG. 3 illustrates a case in which the storage capacitor 140 overlaps with the thin film transistor 130 and the lower electrode 144 is the gate electrode 136 of the thin film transistor 130, the present disclosure is not limited thereto. In another embodiment, the storage capacitor 140 may not overlap with the thin film transistor 130, and the lower electrode 144 may be a separate constituent element independent of the gate electrode 136 of the thin film transistor 130.

The storage capacitor 140 may be covered with a second interlayer insulating layer 107. The second interlayer insulating layer 107 may include an inorganic insulating layer including a material such as SiON, SiOx, and/or SiNx and may include a single layer or a multilayer.

The driving voltage supply line PL may be on a first organic insulating layer 111. The driving voltage supply line PL may include aluminum (Al), copper (Cu), and/or titanium (Ti, or, for example, titanium nitride) and may include a multilayer or a single layer. In an embodiment, the driving voltage supply line PL may have a multilayer structure of Ti/Al/Ti.

FIG. 3 illustrates that a lower driving voltage supply line PL1 is further provided under the first organic insulating layer 111. The lower driving voltage supply line PL1 may be electrically coupled to the driving voltage supply line PL via a contact hole penetrating the first organic insulating layer 111 and may prevent or reduce voltage drop of the driving voltage ELVDD that is supplied through the driving voltage supply line PL. The lower driving voltage supply line PL1 may include the same material as the data line DL. For example, the lower driving voltage supply line PL1 and the data line DL may include Al, Cu, and/or Ti (e.g., titanium nitride) and may include a multilayer or a single layer. In an embodiment, the lower driving voltage supply line PL1 and the data line DL may have a multilayer structure of Ti/Al/Ti or TiN/Al/Ti.

The first organic insulating layer 111 may include an organic insulating material. The organic insulating material may include polymers selected from imide-based polymers, general purpose polymers such as polymethylmethacrylate (PMMA) and/or polystyrene (PS), polymer derivatives having a phenolic group, acrylic polymers, aryl ether-based polymers, amide-based polymers, fluorine-based polymers, p-xylene-based polymers, vinyl alcohol-based polymers, and blends thereof. In an embodiment, the first organic insulating layer 111 may include polyimide.

The driving voltage supply line PL may be covered with a second organic insulating layer 113, and the second organic insulating layer 113 may include imide-based polymers, general purpose polymers such as, for example, those selected from polymethylmethacrylate (PMMA) or polystyrene (PS), polymer derivatives having a phenolic group, acrylic polymers, aryl ether-based polymers, amide-based polymers, fluorine-based polymers, p-xylene-based polymers, vinyl alcohol-based polymers, and blends thereof. In an embodiment, the second organic insulating layer 113 may include polyimide.

A pixel electrode 210 is on the second organic insulating layer 113. A pixel defining layer 120 may be on the pixel electrode 210 and may have an aperture corresponding to a pixel, that is, an aperture exposing at least a center portion of the pixel electrode 210, thereby defining a light-emitting area. Furthermore, the pixel defining layer 120 may prevent or reduce generation of an arc between an edge of the pixel electrode 210 and a common electrode 230 by increasing an interval therebetween. The pixel defining layer 120 may include, for example, an organic material such as polyimide and/or hexamethyldisiloxane (HMDSO).

An intermediate layer 220 may include a low molecular weight material and/or a polymer material. When including a low molecular weight material, the intermediate layer 220 may have a structure in which a hole injection layer (HIL), a hole transport layer (HTL), an emission layer (EML), an electron transport layer (ETL), and an electron injection layer (EIL) are stacked in a single or composite form, and may include various suitable organic materials (e.g., low molecular weight materials) such as, for example, copper phthalocyanine (CuPc), N,N'-Di(naphthalene-1-yl)-N,N'-diphenyl-benzidine (NPB), or tris-8-hydroxyquinoline aluminum (Alq3). These layers may be formed utilizing a vacuum deposition method.

When the intermediate layer 220 includes a polymer material, the intermediate layer 220 may have a structure including the HTL and the EML. In the state, the HTL may include PEDOT, and the EML may include a poly-phenylenevinylene (PPV) based polymer material and a polyfluorene-based polymer material. The structure of the intermediate layer 220 is not limited to the description herein above, and the intermediate layer 220 may have a variety of suitable structures. For example, at least one of layers forming the intermediate layer 220 may be integrally formed across a plurality of pixel electrodes. In some embodiments, the intermediate layer 220 may include a layer that is patterned to correspond to each of the pixel electrodes.

The common electrode 230 may be above the display area DA to cover the display area DA. For example, the common electrode 230 may be integrally formed to cover a plurality of pixels.

In some embodiments, a filler may be between the common electrode 230 and the second substrate 300. The filler may include one or more selected from, for example, a photocurable epoxy-based material and an acrylate-based material, but the present disclosure is not limited thereto.

The second wiring 70 may be in the peripheral area PA on the first substrate 100. The second wiring 70 may include the same material as the driving voltage supply line PL. For example, the second wiring 70 may have a multilayer structure of Ti/Al/Ti. The second wiring 70 may extend along an edge of the first substrate 100 except the edge of the first substrate 100 where the pad area 40 of FIG. 1 is located, and in the other edge, an outer end portion of the second wiring 70 may be covered by a sealing portion 400 and an inner end portion thereof, which is opposite to the outer end portion, may be covered by an conductive layer 212.

The conductive layer 212 may include the same material as the pixel electrode 210. The conductive layer 212 may be coupled to the common electrode 230. In another embodiment, the second wiring 70 may extend toward the display area DA so as to come in direct contact (e.g., physical contact) with the common electrode 230.

The sealing portion 400 may bond the first substrate 100 to the second substrate 300. The sealing portion 400 may include frit and/or epoxy. The frit may be understood as being a paste in which a laser absorbent and/or infrared absorbent, an organic binder, and a filler for reducing a thermal expansion coefficient of the frit are included in a main material such as $SiO_2$. The organic binder and moisture are removed from a frit paste through drying and sintering processes, and the frit paste may be cured. The laser absorbent and/or infrared absorbent may include a transition metal compound. The frit may be cured by a laser so as to form the sealing portion 400. The sealing portion 400 may surround (e.g., completely surround a perimeter of) the display area DA in a plan view as illustrated in FIG. 1. Accordingly, a space defined by the first substrate 100, the second substrate 300, and the sealing portion 400 may be blocked from the outside and thus, intrusion of external moisture or impurities intruding into the display device 10 may be prevented or reduced.

Furthermore, the sealing portion 400 may extend along the second wiring 70 so as to cover the outer end portion of the second wiring 70 and may come in direct contact (e.g., physical contact) with a part (e.g., a portion) of the second wiring 70 by overlapping the same. Accordingly, comparing with a case in which the sealing portion 400 is located further outside the second wiring 70, the area of the peripheral area PA of the display device 10 of FIG. 1.

A pressure sensing unit 500 may be located on the second substrate 300. The pressure sensing unit 500 may be formed directly on an upper surface of the second substrate 300. In an example, the pressure sensing unit 500 may be a capacitive type (e.g., a capacitive kind) in which a change in capacitance is generated by a touch.

Figure 4:
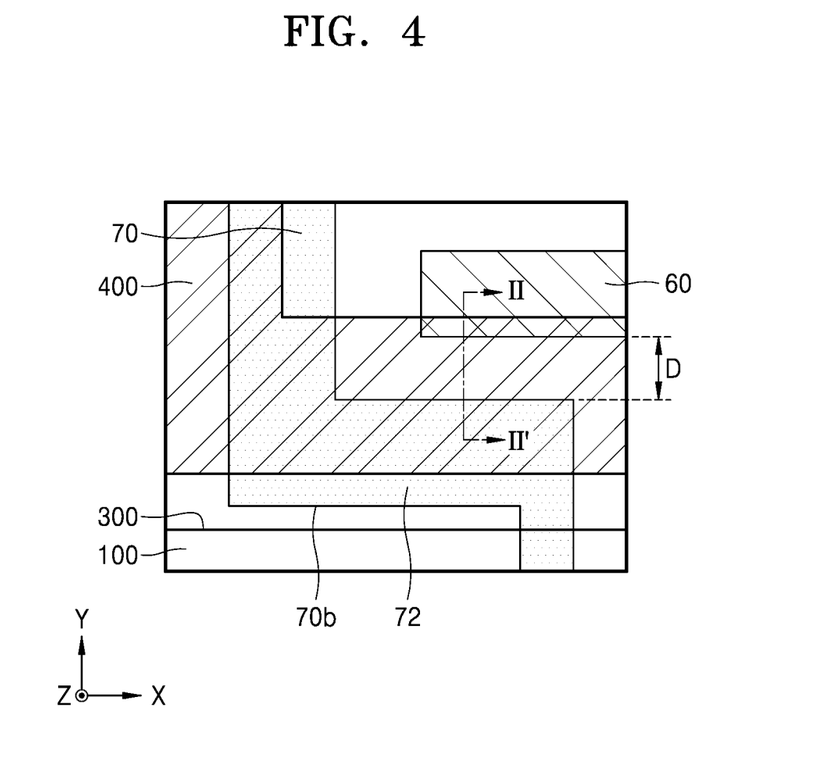
FIG. 4 is a plan view schematically illustrating a portion A of FIG. 1, according to an embodiment.
Figure 5:
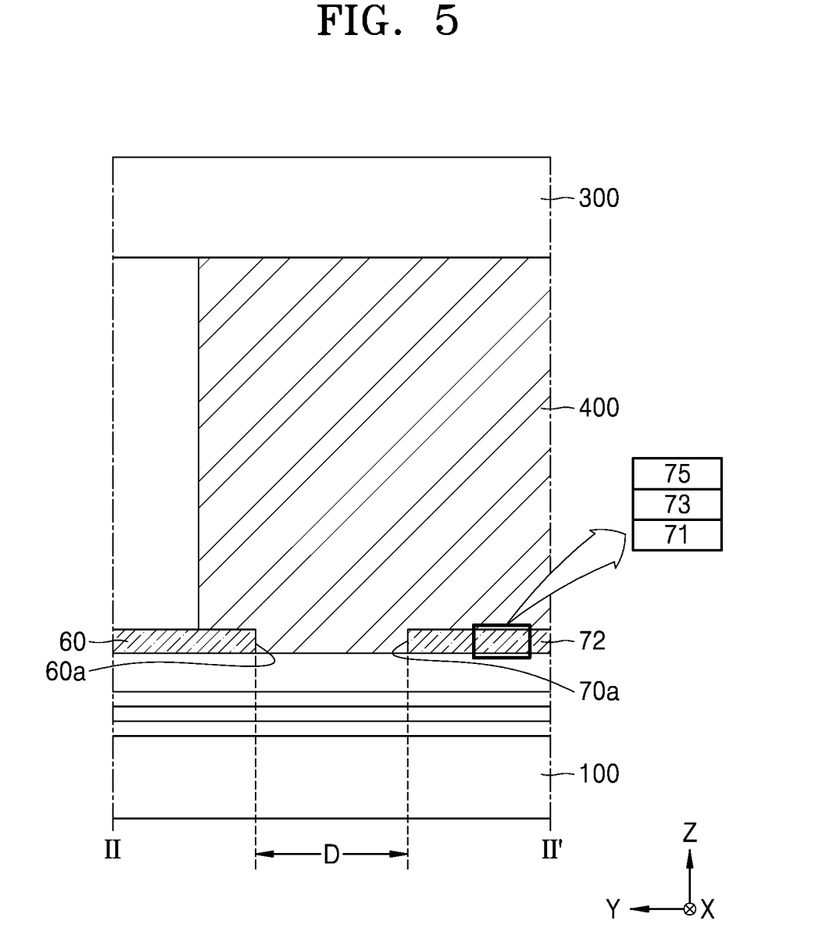
FIG. 5 is a schematic cross-sectional view taken along line II-II' of FIG. 4, according to an embodiment.
Figure 6:
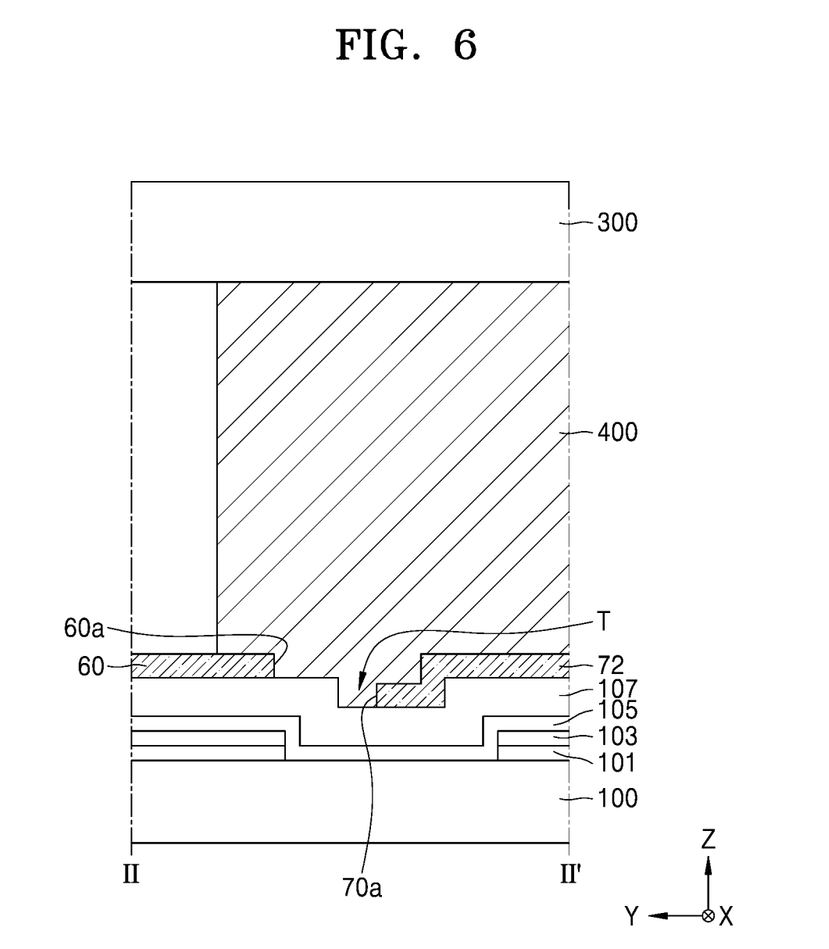
FIG. 6 is a schematic cross-sectional view taken along line II-II' of FIG. 4, according to another embodiment.

FIG. 4 is a plan view schematically illustrating a region A of FIG. 1, according to an embodiment. FIG. 5 is a schematic cross-sectional view taken along line II-II' of FIG. 4, according to an embodiment. FIG. 6 is a schematic cross-sectional view taken along line II-II' of FIG. 4, according to another embodiment.

As illustrated in FIG. 4, in order to be coupled to the terminal 45 of FIG. 1, the second wiring 70 may be bent in the form of surrounding an end portion of the first wiring 60, and the bent portion may be in parallel (e.g., substantially in parallel) to the first wiring 60 in the first direction X. In other words, the second wiring 70 may include an extension portion 72 in parallel (e.g., substantially in parallel) to the first wiring 60 between the display area DA of FIG. 1 and the pad area 40 of FIG. 1. The extension portion 72 is located between the first wiring 60 and an edge of the first substrate 100.

With a trend of reducing the peripheral area PA of FIG. 1, a distance D between the extension portion 72 and the first wiring 60 may decrease, and the sealing portion 400 may be located to overlap with the extension portion 72, in a plane view (e.g., a plan view). In this state, when laser light is irradiated to the sealing portion 400 to form the sealing portion 400, heat is applied to the extension portion 72 located under the sealing portion 400, and thus, a short-circuit may be generated between the second wiring 70 and the first wiring 60.

In more detail, the second wiring 70 may have a stack structure of a first layer 71 including Ti, a second layer 73 including Al, and a third layer 75 including Ti (as shown in FIG. 5), and as a melting temperature of Al is lower than a melting temperature of the sealing portion 400, when laser light is irradiated to the sealing portion 400, Al is melt-extruded from the second layer 73, and thus, a short-circuit may be generated between the second wiring 70 and the first wiring 60. Accordingly, to prevent (or to reduce a likelihood or degree of) the foregoing, as illustrated in FIG. 5, the sealing portion 400 may fill an area between the extension portion 72 and the first wiring 60.

In an example, the sealing portion 400 may overlap with a part (e.g., a portion) of the extension portion 72 and a part (e.g., a portion) of the first wiring 60, in a plane view (e.g., a plan view), and may come in contact with a side surface 70a of the extension portion 72 and a side surface 60a of the first wiring 60 arranged to face each other in an area between the extension portion 72 and the first wiring 60. In some embodiments, when laser light is irradiated to the sealing portion 400, the melt-extrusion of Al from the side surface 70a of the extension portion 72 is prevented or reduced, and thus, even when the distance D between the extension portion 72 and the first wiring 60 decreases, a short-circuit between the second wiring 70 and the first wiring 60 may be prevented (or a likelihood or degree of such a short-circuit is reduced).

In another example, as illustrated in FIG. 6, the short-circuit between the second wiring 70 and the first wiring 60 due to the Al melt-extrusion may be prevented (or a likelihood or degree of such a short-circuit may be reduced) by placing, at different heights, the side surface 70a of the extension portion 72 and the side surface 60a of the first wiring 60 facing each other. In an example, a trap T having a concave shape is formed in the area between the extension portion 72 and the first wiring 60, and as the side surface 70a of the extension portion 72 facing the first wiring 60 is located in the trap T, the side surface 70a may be located at a height lower than the side surface 60a of the first wiring 60 facing the extension portion 72.

The trap T may be formed by partially removing the inorganic layers under the first wiring 60 and the extension portion 72. Although FIG. 6 illustrates an example in which a step is generated between the first interlayer insulating layer 105 and the second interlayer insulating layer 107 by removing the buffer layer 101 and the gate insulating layer 103, the present disclosure is not limited thereto and the trap T may be formed by partially removing the first interlayer insulating layer 105 and/or the second interlayer insulating layer 107.

As such, when the side surface 70a of the extension portion 72 is located in the trap T, even when Al is melt-extruded from the side surface 70a of the extension portion 72, the melt-extruded Al is prevented by the trap T from reaching the side surface 60a of the first wiring 60 (or the trap T reduces the amount of the melt-extruded Al that reaches the side surface 60a, or reduces a likelihood that the melt-extruded Al that reaches the side surface 60a), and thus, the short-circuit between the second wiring 70 and the first wiring 60 due to the Al melt-extrusion during the forming of the sealing portion 400 may be further effectively prevented (or a likelihood or degree of such a short-circuit may be reduced).

As illustrated in FIG. 4, an outer edge 70b of the extension portion 72 may be located outside the sealing portion 400. In other words, the extension portion 72, which is arranged in a direction parallel (e.g., substantially parallel) to the first direction X between the first wiring 60 and the pad area 40 of FIG. 1, may be provided such that the outer edge 70b thereof is between the sealing portion 400 and a side of the second substrate 300, in a plane view (e.g., a plan view). Accordingly, as external static electricity is induced to the extension portion 72, intrusion of static electricity to the pressure sensing unit 500 of FIG. 3 may be blocked or reduced, and thus, generation of a touch error in the pressure sensing unit 500 due to static electricity may be prevented (or a likelihood of such an error may be reduced). The static electricity induced to the extension portion 72 may spread wide in the second wiring 70 so as not to affect the display device 10 of FIG. 1.

Figure 7:
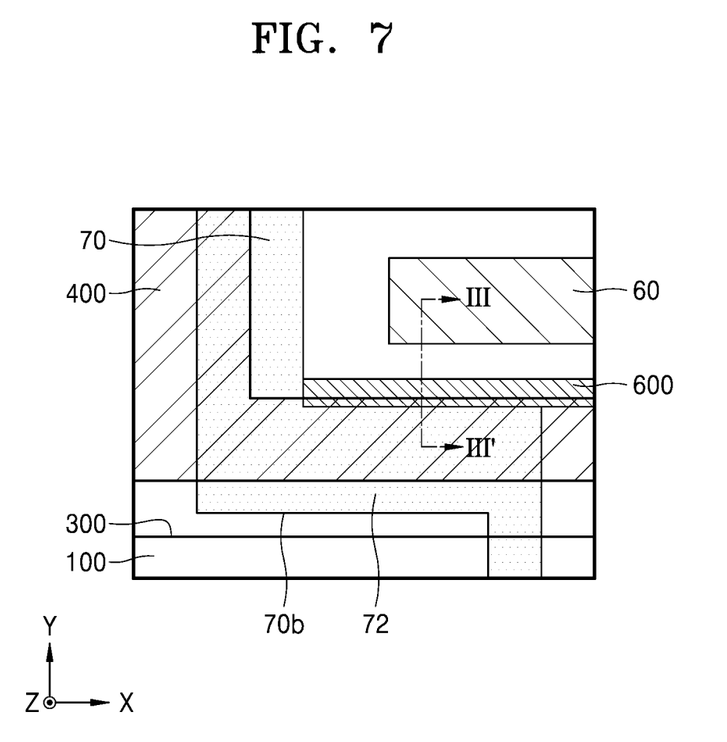
FIG. 7 is a plan view schematically illustrating the portion A of FIG. 1, according to another embodiment.
Figure 8:
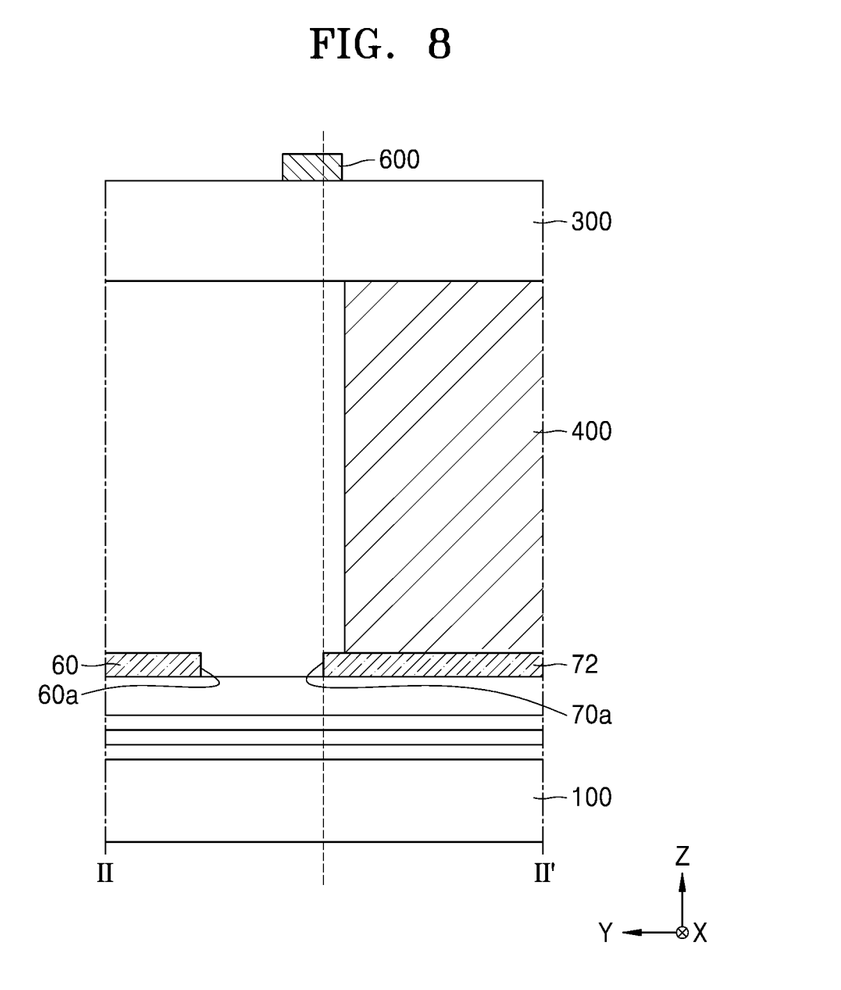
FIG. 8 is a schematic cross-sectional view taken along line III-III' of FIG. 7, according to an embodiment.
Figure 9:
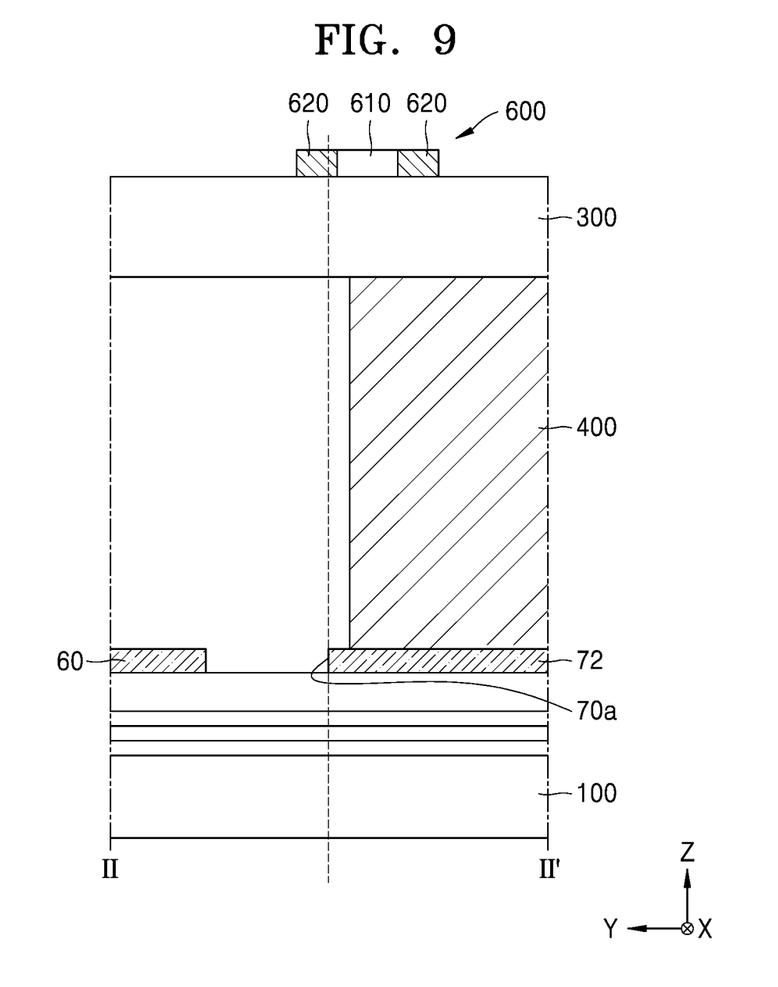
FIG. 9 is a schematic cross-sectional view taken along line III-III' of FIG. 7, according to another embodiment.
Figure 10:
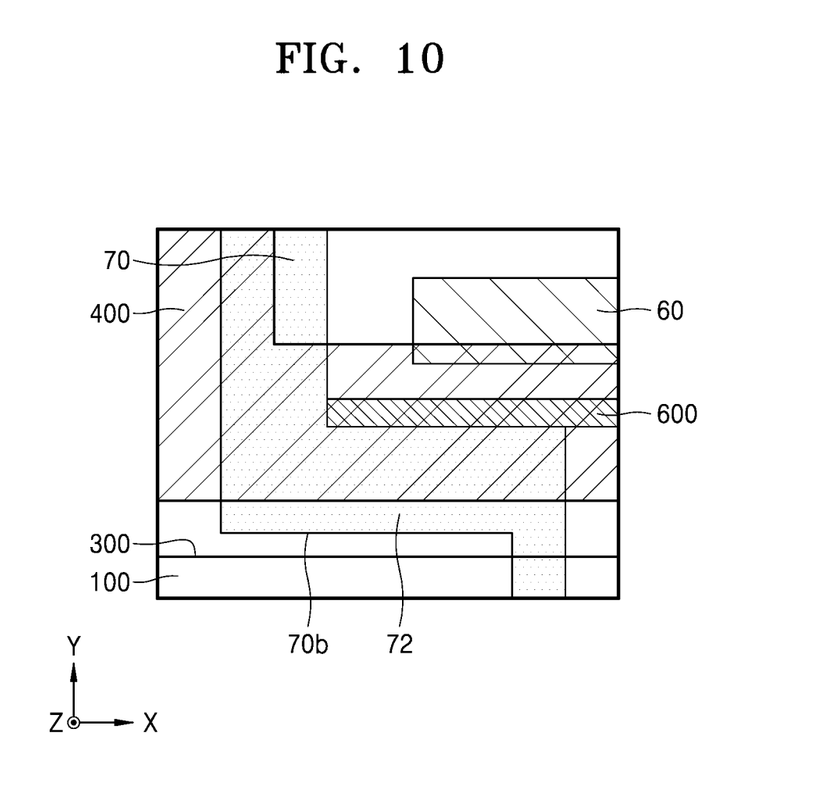
FIG. 10 is a plan view schematically illustrating the portion A of FIG. 1, according to another embodiment.

FIG. 7 is a plan view schematically illustrating the portion A of FIG. 1, according to another embodiment. FIG. 8 is a schematic cross-sectional view taken along line III-III' of FIG. 7. FIG. 9 is a schematic cross-sectional view taken along line III-III' of FIG. 7, according to another embodiment. FIG. 10 is a plan view schematically illustrating the region A of FIG. 1, according to another embodiment.

First, referring to FIGS. 7 and 8, between the display area DA of FIG. 1 and the pad area 40 of FIG. 1, the second wiring 70 may include the extension portion 72 arranged in parallel (e.g., substantially in parallel) to the first wiring 60, and the sealing portion 400 may extend in the first direction X at a position overlapping with the extension portion 72. As described herein above, when laser light is irradiated to the sealing portion 400 to form the sealing portion 400, Al is melt-extruded from the extension portion 72, and thus, a short-circuit may be generated between the second wiring 70 and the first wiring 60, and thus, to prevent (or to reduce a likelihood or degree of) the foregoing, a blocking pattern 600 may be located on the second substrate 300.

The blocking pattern 600, which is formed during the forming of the pressure sensing unit 500 of FIG. 3 and thus, includes the same material as a wiring of the pressure sensing unit 500, may have conductivity (e.g., electrical conductivity). In an example, the blocking pattern 600 may include an opaque metal material.

The blocking pattern 600 may block the irradiated laser light to control the range of curing of the sealing portion 400 and may also be located to cover the side surface 70a of the extension portion 72 facing the first wiring 60, in a plane view (e.g., a plan view), and thus, when laser light is irradiated to the sealing portion 400, the melt-extrusion of Al from the side surface 70a of the extension portion 72 may be prevented (or a likelihood or degree of melt-extrusion of Al from the side surface 70a may be reduced). In some embodiments, a short-circuit generated between the second wiring 70 and the first wiring 60 may be prevented (or a likelihood or degree of such a short-circuit may be reduced).

In another example, as illustrated in FIG. 9, the blocking pattern 600 may include a plurality of regions, for example, first region 610 and the second region 620. In an example, the blocking pattern 600 may include the first region 610 having transmissivity and the second region 620 located at at least one side of the first region 610. The second region 620 may include an opaque metal material. The first region 610 may include the same material as a touch pattern of the pressure sensing unit 500 of FIG. 3, and the second region 620 may include the same material as the wiring of the pressure sensing unit 500.

As such, the blocking pattern 600 is at the edge of the sealing portion 400 and controls the curing range of the sealing portion 400, and, for example, the second region 620 may be located to overlap with the side surface 70a of the extension portion 72, in a plane view (e.g., a plan view), thereby preventing the melt-extrusion of Al from the side surface 70a of the extension portion 72 (or thereby reducing a likelihood or degree of melt-extrusion of Al from the side surface 70a).

FIG. 9 illustrates an example in which the second region 620 is at the other side of the first region 610. The second region 620 at the other side of the first region 610 may be located at a center area of the laser light irradiated to the sealing portion 400. In some embodiments, the profile of the laser light irradiated by the second region 620 at the other side of the first region 610 may be changed to a form in which energy decreases in the center area of the Gaussian distribution, and thus, the sealing portion 400 may be uniformly (e.g., substantially uniformly) cured at large.

As described herein above, as the blocking pattern 600 is formed on the second substrate 300 to cover the side surface 70a of the extension portion 72, in a plane view (e.g., a plan view), even when laser light is irradiated to form the sealing portion 400, the melt-extrusion of Al from the side surface 70a of the extension portion 72 may be prevented or reduced. However, as described herein above, the blocking pattern 600 may include a metal material, and with a trend of reducing the peripheral area PA of FIG. 1, the distance between the blocking pattern 600 and the pressure sensing unit 500 of FIG. 3 may decrease, and thus, the blocking pattern 600 may serve as a path through which external static electricity flows into the pressure sensing unit 500 of FIG. 3.

However, according to embodiments of the present disclosure, as the outer edge 70b of the extension portion 72 arranged in parallel (e.g., substantially in parallel) to the first wiring 60 is located outside the sealing portion 400, and thus, external static electricity is induced to the second wiring 70, the inflow of the static electricity to the pressure sensing unit 500 may be prevented or reduced by the blocking pattern 600. For example, in some embodiments, in a plane view (e.g., a plan view), the extension portion 72 may be located further outside the blocking pattern 600.

Although FIGS. 7 to 9 illustrate an example in which the sealing portion 400 is located only on the extension portion 72, the present disclosure is not limited thereto. In other words, as illustrated in FIG. 10, the sealing portion 400 that bonds the first substrate 100 to the second substrate 300 is located to overlap with a part (e.g., a portion) of the extension portion 72 and a part (e.g., a portion) of the first wiring 60, filling therebetween, and the blocking pattern 600 is further formed on the second substrate 300, thereby further preventing (or further reducing a likelihood or degree of) a short-circuit between the second wiring 70 and the first wiring 60 (e.g., driving power wiring 60). Furthermore, as the trap T of FIG. 6 is located between the extension portion 72 and the first wiring 60 (e.g., the driving power wiring 60), and a side surface of the extension portion 72 facing the first wiring 60 (e.g., the driving power wiring 60) is located in the trap T, the outer edge 70b of the extension portion 72 may be located outside the sealing portion 400.

According to the embodiments of the present disclosure, even when the non-display area of a display device decreases, a short-circuit between wirings may be effectively prevented (or a likelihood or degree of such a short-circuit may be reduced). The scope of the present disclosure, however, is not limited by such an effect.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope of the present disclosure as defined by the appended claims, and equivalents thereof.

What is claimed is:

1. A display device comprising:
a first substrate;
a plurality of pixels over the first substrate;
a second substrate over the plurality of pixels;
a sealing portion surrounding the plurality of pixels and located between the first substrate and the second substrate;
a first electrode extending in a first direction outside the plurality of pixels; and
a second electrode partially surrounding the plurality of pixels, in a plane view,
wherein the second electrode comprises a bent portion, the bent portion comprising a first portion arranged in parallel to the first direction between the first electrode and an edge of the first substrate, and
the sealing portion is located between the first portion and the first electrode.

2. The display device of claim 1, wherein:
the sealing portion overlaps a portion of the first portion and a portion of the first electrode and comes in contact with a side surface of the first portion and a side surface of the first electrode, which are arranged to face each other, in an area between the first portion and the first electrode.

3. The display device of claim 2, wherein:
an outer edge of the first portion is located outside the sealing portion.

4. The display device of claim 2, wherein:
an outer edge of the first portion is located between the sealing portion and a side of the second substrate, in a plane view.

5. The display device of claim 1, wherein:
a side surface of the first portion and a side surface of the first electrode facing each other are located at different heights.

6. The display device of claim 5, wherein:
a trap having a concave shape is located between the first portion and the first electrode, and the side surface of the first portion is located in the trap.

7. The display device of claim 1, further comprising:
a blocking pattern over the second substrate,
wherein the blocking pattern covers a side surface of the first portion facing the first electrode, in a plane view.

8. The display device of claim 7, wherein:
the blocking pattern comprises a first region having transmissivity and a second region that is opaque and located at at least one side of the first region, and
the second region covers the side surface of the first portion.

9. The display device of claim 1, wherein:
each of the plurality of pixels comprises a thin film transistor and an organic light-emitting device electrically coupled to the thin film transistor.

10. The display device of claim 1, wherein:
the second electrode has a structure in which a first layer, a second layer, and a third layer are sequentially stacked, the first layer and the third layer comprising Ti and the second layer comprising Al.

11. A display device comprising:
a first substrate comprising a display area, a peripheral area around the display area, and a pad area in the peripheral area;
a second substrate above the first substrate and having an area less than the first substrate;
a sealing portion surrounding the display area and between the first substrate and the second substrate;
a first electrode in the peripheral area and extending in a first direction between the pad area and one side of the display area adjacent to the pad area;
a second electrode partially surrounding the display area; and
a blocking pattern over the second substrate,
wherein the second electrode comprises a bent portion, the bent portion comprising a first portion extending in the first direction between the first electrode and the pad area, and
in a plane view, the blocking pattern is located to cover a side surface of the first portion facing the first electrode, and an outer edge of the first portion is located between the sealing portion and a side of the second substrate.

12. The display device of claim 11, wherein:
the sealing portion is located over the first portion.

13. The display device of claim 11, further comprising:
a pressure sensing unit over the second substrate,
wherein the blocking pattern comprises a same material as a wiring of the pressure sensing unit.

14. The display device of claim 13, wherein:
the first portion is located further outside the blocking pattern, in a plane view.

15. The display device of claim 11, wherein:
the blocking pattern comprises a first region having transmissivity and a second region that is opaque and is located at at least one side of the first region, and
the second region covers the side surface of the first portion.

16. The display device of claim 11, wherein:
the sealing portion is located between the first portion and the first electrode.

17. The display device of claim 16, wherein:
the sealing portion overlaps a portion of the first portion and a portion of the first electrode and comes in contact with a side surface of the first portion and a side surface of the first electrode, which are arranged to face each other, in an area between the first portion and the first electrode.

18. The display device of claim 11, wherein:
a trap having a concave shape is located between the first portion and the first electrode, and the side surface of the first portion facing the first electrode is located in the trap so as to be located at a height lower than a side surface of the first electrode facing the first portion.

19. The display device of claim 11, wherein:
the sealing portion extends along the second electrode covering an outer end portion of the second electrode and comes in direct contact with the second electrode.

20. The display device of claim 11, wherein:
a plurality of pixels are located in the display area, each of the plurality of pixels comprising a thin film transistor and an organic light-emitting device electrically coupled to the thin film transistor.

* * * * *